(12) United States Patent
Polishchuk et al.

(10) Patent No.: US 8,859,374 B1
(45) Date of Patent: Oct. 14, 2014

(54) MEMORY TRANSISTOR WITH MULTIPLE CHARGE STORING LAYERS AND A HIGH WORK FUNCTION GATE ELECTRODE

(75) Inventors: Igor Polishchuk, Fremont, CA (US);
Sagy Levy, Zichron Ya'aqov (IL);
Krishnaswamy Ramkumar, San Jose, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 336 days.

(21) Appl. No.: 13/288,919

(22) Filed: Nov. 3, 2011

Related U.S. Application Data

(62) Division of application No. 12/152,518, filed on May 13, 2008, now Pat. No. 8,063,434.

(60) Provisional application No. 60/940,160, filed on May 25, 2007.

(51) Int. Cl.
*H01L 21/336* (2006.01)

(52) U.S. Cl.
USPC .......................................... 438/287; 438/288

(58) Field of Classification Search
CPC ................ H01L 27/085; H01L 27/105; H01L 27/11563; H01L 27/11573
USPC ........................... 257/324, 326; 438/287, 288
See application file for complete search history.

(56) References Cited

U.S. PATENT DOCUMENTS

| | | | |
|---|---|---|---|
| 4,843,023 A | 6/1989 | Chiu et al. | |
| 6,214,689 B1 | 4/2001 | Lim et al. | |
| 6,429,081 B1 | 8/2002 | Doong et al. | |
| 6,469,343 B1 | 10/2002 | Miura et al. | |
| 6,610,614 B2 | 8/2003 | Niimi et al. | |
| 6,906,390 B2 | 6/2005 | Nomoto et al. | |
| 6,912,163 B2 | 6/2005 | Zheng et al. | |
| 7,045,424 B2 | 5/2006 | Kim et al. | |
| 7,262,457 B2 | 8/2007 | Hsu et al. | |
| 7,312,496 B2 | 12/2007 | Hazama | |
| 7,323,742 B2 | 1/2008 | Georgescu | |
| 7,576,386 B2 | 8/2009 | Lue et al. | |
| 7,642,585 B2 * | 1/2010 | Wang et al. | 257/296 |

(Continued)

FOREIGN PATENT DOCUMENTS

| | | |
|---|---|---|
| WO | 2008129478 A | 10/2008 |
| WO | 2011162725 A | 12/2011 |

OTHER PUBLICATIONS

USPTO Non-Final Rejection for U.S. Appl. No. 12/152,518 dated Mar. 9, 2011; 4 pages.

(Continued)

*Primary Examiner* — Ngan Ngo

(57) ABSTRACT

Semiconductor devices including non-volatile memory transistors and methods of fabricating the same to improve performance thereof are provided. In one embodiment, the method comprises: (i) forming an oxide-nitride-oxide (ONO) dielectric stack on a surface of a semiconductor substrate in at least a first region in which a non-volatile memory transistor is to be formed, the ONO dielectric stack including a multi-layer charge storage layer; (ii) forming an oxide layer on the surface of the substrate in a second region in which a metal oxide semiconductor (MOS) logic transistor is to be formed; and (iii) forming a high work function gate electrode on a surface of the ONO dielectric stack. Other embodiments are also disclosed.

16 Claims, 4 Drawing Sheets

(56) References Cited

U.S. PATENT DOCUMENTS

| | | | |
|---|---|---|---|
| 7,688,626 B2 * | 3/2010 | Lue et al. | 365/185.05 |
| 7,723,789 B2 | 5/2010 | Lin et al. | |
| 7,737,488 B2 | 6/2010 | Lai et al. | |
| 7,790,516 B2 * | 9/2010 | Willer et al. | 438/129 |
| 7,948,799 B2 * | 5/2011 | Lue et al. | 365/185.17 |
| 7,999,295 B2 | 8/2011 | Lai et al. | |
| 8,067,284 B1 | 11/2011 | Levy | |
| 8,222,688 B1 | 7/2012 | Jenne et al. | |
| 8,264,028 B2 * | 9/2012 | Lue et al. | 257/324 |
| 8,315,095 B2 * | 11/2012 | Lue et al. | 365/185.05 |
| 8,318,608 B2 | 11/2012 | Ramkumar et al. | |
| 8,482,052 B2 * | 7/2013 | Lue et al. | 257/324 |
| 2001/0052615 A1 | 12/2001 | Fujiwara | |
| 2003/0122204 A1 | 7/2003 | Nomoto et al. | |
| 2003/0169629 A1 | 9/2003 | Goebel et al. | |
| 2003/0183869 A1 | 10/2003 | Crivelli et al. | |
| 2004/0173918 A1 | 9/2004 | Kamal et al. | |
| 2005/0070126 A1 | 3/2005 | Senzaki | |
| 2005/0186741 A1 | 8/2005 | Roizin et al. | |
| 2005/0230766 A1 | 10/2005 | Nomoto et al. | |
| 2005/0266637 A1 | 12/2005 | Wang | |
| 2006/0051880 A1 | 3/2006 | Doczy et al. | |
| 2006/0081331 A1 | 4/2006 | Campian | |
| 2006/0131636 A1 | 6/2006 | Jeon et al. | |
| 2006/0202261 A1 * | 9/2006 | Lue et al. | 257/324 |
| 2006/0281331 A1 | 12/2006 | Wang | |
| 2007/0048916 A1 | 3/2007 | Suzuki et al. | |
| 2007/0215940 A1 | 9/2007 | Ligon | |
| 2007/0246753 A1 | 10/2007 | Chu et al. | |
| 2007/0262451 A1 | 11/2007 | Rachmady et al. | |
| 2007/0267687 A1 | 11/2007 | Lue | |
| 2007/0268753 A1 * | 11/2007 | Lue et al. | 365/185.28 |
| 2007/0272916 A1 | 11/2007 | Wang et al. | |
| 2008/0009115 A1 | 1/2008 | Willer et al. | |
| 2008/0029399 A1 | 2/2008 | Tomita et al. | |
| 2008/0048237 A1 | 2/2008 | Iwata | |
| 2008/0135946 A1 | 6/2008 | Yan | |
| 2008/0175053 A1 * | 7/2008 | Lue et al. | 365/185.05 |
| 2008/0237694 A1 | 10/2008 | Specht et al. | |
| 2008/0290399 A1 | 11/2008 | Levy et al. | |
| 2008/0290400 A1 | 11/2008 | Jenne et al. | |
| 2008/0291726 A1 * | 11/2008 | Lue et al. | 365/185.05 |
| 2008/0293207 A1 | 11/2008 | Koutny, Jr. et al. | |
| 2008/0293254 A1 | 11/2008 | Ramkumar et al. | |
| 2008/0293255 A1 | 11/2008 | Ramkumar | |
| 2009/0039414 A1 | 2/2009 | Lue et al. | |
| 2009/0045452 A1 * | 2/2009 | Lue et al. | 257/321 |
| 2009/0179253 A1 | 7/2009 | Levy et al. | |
| 2010/0041222 A1 | 2/2010 | Puchner et al. | |
| 2010/0117138 A1 | 5/2010 | Huerta et al. | |
| 2010/0117139 A1 * | 5/2010 | Lue | 257/324 |
| 2010/0155823 A1 * | 6/2010 | Lue et al. | 257/324 |
| 2010/0295118 A1 | 11/2010 | Bhattacharyya | |
| 2011/0018053 A1 | 1/2011 | Lo Guo et al. | |
| 2011/0163371 A1 | 7/2011 | Song et al. | |
| 2011/0248332 A1 | 10/2011 | Levy et al. | |
| 2012/0068159 A1 | 3/2012 | Fujiki et al. | |
| 2013/0175604 A1 | 7/2013 | Polishchuk et al. | |

OTHER PUBLICATIONS

USPTO Non-Final Rejection for U.S. Appl. No. 12/152.518 dated Sep. 29, 2010; 5 pages.
USPTO Notice of Allowance for U.S. Appl. No. 12/152,518 dated Jul. 14, 2011; 6 pages.
"MAX 9000 Programmable Logic Device Family," Altera, Jul. 1999, Version 6.01, pp. 1-40; 41 pages.
L. Richard Carley, "Trimming Analog Circuits Using Floating-Gate Analog MOS Memory," IEEE Journal of Solid-State Circuits, vol. 24, No. 6, Dec. 1989, pp. 1569-1575; 7 pages.
"1.8V, 500-MHz, 10-Output JEDEC-Compliant Zero Delay Buffer," Cypress Advance Information, Feb. 12, 2004; 9 pages.
"10 Gigabit Ethernet Technology Overview White Paper", Revision 1.0, Retrieved from Internet: URL: http://www.10gea.org, May, 2001.
"16K x 8/9 Dual-Port Static RAM with Sem, Int, Busy," Cypress Semiconductor Data Book, May 1995, CY7C006 and CY7C016, pp. 6:1-17; 10 pages.
"1K x 8 Dual-Port Static RAM," Cypress Semiconductor Data Book, May 1995, CY7C130/CY7C131 and CY7C140/CY7C141, pp. 6:37-49; 8 pages.
"1kHz to 30MHz Resistor Set SOT-23 Oscillator" , Initial Release Final Electrical Specifications LTC1799, Linear Technology Corporation, Jan. 2001, pp. 1-4.
"200-MBaud HOTLink Transceiver," Cypress Semiconductor Corporation, Revised Feb. 13, 2004, CY7C924ADX, Document #38-02008 Rev. *D; 62 pages.
"2K x 16 Dual-Port Static RAM," Cypress Semiconductor Data Book, May 1995, CY7C133 and CY7C143, pp. 6:63-73; 7 pages.
"2K x 8 Dual-Port Static RAM," Cypress Semiconductor Data Book, May 1995, CY7C132/CY7C136 and CY7C142/CY7C146, pp. 6:50-62; 8 pages.
"A Novel Integration Technology of EEPROM Embedded CMOS Logic VLSI Suitable for ASIC Applications", By Masataka Takebuchi et al., IEEE 1992 Custom Integrated Circuits Conference, pp. 9.6.1-9.6.4.
"A Novel Robust and Low Cost Stack Chips Package and Its Thermal Performance", By Soon-Jin Cho et al., IEEE Transaction on Advanced Packaging, vol. 23, No. 2, May 2000, pp. 257-265.
"A Planar Type EEPROM Cell Structure by Standard CMOS Process for Integration with Gate Array, Standard Cell, Microprocessor and for Neural Chips", By Katsuhiko Ohsaki et al., IEEE 1993 Custom Integrated Circuits Conference, pp. 23.6.1-23.6.4.
"A Single Chip Sensor & Image Processor for Fingerprint Verification" Anderson, S., et al., IEEE Custom Integrated Circuits Conference, May 12-15, 1991.
"A Single Poly EPROM for Custom CMOS Logic Applications", By Reza Kazerounian et al., IEEE 1986 Custom Integrated Circuits Conference, pp. 59-62.
"A Wide-Bandwidth Low-Voltage PLL for PowerPC.TM. Microprocessors", By Jose Alvarez et al., IEEE Journal of Solid-State Circuits, vol. 30, No. 4, Apr. 1995, pp. 383-391.
"About SMaL Camera Technologies, Inc.", SMaL Camera Technologies, 2001, 1 page.
"Achieving Uniform nMOS Device Power Distribution for Sub-micron ESD Reliability;" Charvaka Duvvuy, Carlos Diaz, and Tim Haddock; 1992; 92-131 through 92-134, no month.
"ADNS-2030 High Performance, Low Power Optical Mouse Sensor (Optimized for Cordless Mouse Applications)," Agilent Technologies, downloaded Oct. 10, 2005, <http://www.home.agilent.com/USeng/nav/-536893734,536883737/pd.html>, 2 pages.
"Agilent ADNK-2030 Solid-State Optical Mouse Sensor," Agilent Technologies Inc., Sample Kit, 2003; 1 page.
"Agilent ADNS-2030 Low Power Optical Mouse Sensor," Agilent Technologies Inc., Data Sheet, 2005; 34 pages.
"Agilent ADNS-2051 Optical Mouse Sensor," Agilent Technologies Inc., Product Overview, 2003; 2 pages.
"Agilent Optical Mouse Sensors," Agilent Technologies Inc., Selection Guide, 2004; 3 pages.
"Algorithm for Managing Multiple First-In, First-Out Queues from a Single Shared Random-Access Memory," IBM Technical Disclosure Bulletin, Aug. 1989; 5 pages.
"Am99C10A 256.times.48 Content Addressable Memory", Advanced Micro Devices, Dec. 1992.
"An Analog PLL-Based Clock and Data Recovery Circuit with High Input Jitter Tolerance", By Sam Yinshang Sun, Reprinted from IEEE Journal of Solid-State Circuits, vol. SC-24, pp. 325-330, Apr. 1989, pp. 383-385.
"An EEPROM for Microprocessors and Custom Logic", By Roger Cuppens et al., IEEE Journal of Solid-State Circuits, vol. SC-20, No. 2, Apr. 1985, pp. 603-608.
"An EPROM Cell Structure foe EPLDs Compatible with Single Poly Gate Process", By Kuniyushi Yoshikawa et al., Extended Abstracts of the 18th (1986 International) Conference on Solid State Devices and Materials, Tokyo, 1986, pp. 323-326.

(56) References Cited

OTHER PUBLICATIONS

"An Experimental 5-V-Only 256-kbit CMOS EEPROM with a High-Performance Single-Polysilicon Cell", By Jun-Ichi Miyamoto et al., IEEE Journal of Solid State Circuits, vol. SC-21, No. 5, Oct. 1986, pp. 852-860.
U.S. Appl. No. 14/159,315: "Memory Transistor With Multiple Charge Storing Layers and a High Work Function Gate Electrode" Igor Polishchuk et al., filed on Jan. 20, 2014; 60 pages.
Chen et al., "Performance Improvement of SONOS Memory by Bandgap Engineering of Charge-Trapping Layer," IEEE Electron Device Letters, Apr. 2004, vol. 25, No. 4, pp. 205-207; 3 pages.
International Search Report for International Application No. PCT/US13/48885 dated Nov. 14, 2013; 2 pages.
Lue et al., "BE-SONOS: A Bandgap Engineered SONOS with Excellent Performance and Reliability," IEEE, 2005; 4 pages.
Lue, Hang-Ting et al., "Reliability Model of Bandgap Engineered SONOS (be-SONOS)", IEEE, 2006, 4 pgs.
USPTO Missing Parts for U.S Appl. No. 13/539,466 dated Jul. 17, 2012; 2 pages.
USPTO Non-Final Rejection for U.S. Appl. No. 13/539,466 dated Sep. 28, 2012; 9 pages.
USPTO Notice of Allowance for U.S Appl. No. 13/539,466 dated Nov. 27, 2012; 8 pages.
USPTO Requirement for Restriction for U.S. Appl. No. 12/152,518 dated Jun. 9, 2010; 5 pages.
Wang, Szu-Yu et al., "Reliability and processing effects of bandgap engineered SONOS flash memory", 2007 IEEE, International Reliability Symposium, Apr. 18, 2007, 5 pgs.
Wu et al., "SONOS Device with Tapered Bandgap Nitride Layer," IEEE Transactions on Electron Devices, May 2005, vol. 52, No. 5, pp. 987-992; 6 pages.
Yang et al., "Reliability considerations in scaled SONOS nonvolatile memory devices, solid state Electronics", 43(1999) 2025-2032.

\* cited by examiner

US 8,859,374 B1

MEMORY TRANSISTOR WITH MULTIPLE CHARGE STORING LAYERS AND A HIGH WORK FUNCTION GATE ELECTRODE

CROSS-REFERENCE TO RELATED APPLICATIONS

The present application is a divisional of U.S. application Ser. No. 12/152,518, filed on May 13, 2008, now U.S. Pat. No. 8,063,434 issued on Nov. 22, 2011, which claims the benefit of priority under 35 U.S.C. 119(e) to U.S. Provisional Patent Application Ser. No. 60/940,160, entitled "SONOS Gate Stack With Multiple Oxynitride Layers And A High Work-function Gate Electrode," filed May 25, 2007, both of which applications are hereby incorporated by reference in their entirety.

TECHNICAL FIELD

The present invention relates generally to semiconductor devices, and more particularly to integrated circuits including non-volatile semiconductor memories and methods of fabricating the same.

BACKGROUND OF THE INVENTION

Non-volatile semiconductor memories are devices that can be electrically erased and reprogrammed. One type of non-volatile memory that is widely used for general storage and transfer of data in and between computers and other electronic devices is flash memory, such as a split gate flash memory. A split gate flash memory transistor has an architecture similar to that of a conventional logic transistor, such as Metal-Oxide-Semiconductor Field Effect Transistor (MOSFET), in that it also includes a control gate formed over a channel connecting a source and drain in a substrate. However, the memory transistor further includes a memory or charge trapping layer between the control gate and the channel and insulated from both by insulating or dielectric layers. A programming voltage applied to the control gate traps a charge on the charge trapping layer, partially canceling or screening an electric field from the control gate, thereby changing a threshold voltage ($V_T$) of the transistor and programming the memory cell. During read-out, this shift in $V_T$ is sensed by the presence or absence of current flow through the channel with application of a predetermined read-out voltage. To erase the memory transistor, an erase voltage is applied to the control gate to restore, or reverse the shift in $V_T$.

An important measure of merit for flash memories is data retention time, which is the time for which the memory transistor can hold charge or remain programmed without the application of power. The charge stored or trapped in the charge trapping layer decreases over time due to leakage current through the insulating layers, thereby reducing the difference between a programmed threshold voltage (VTP) and an erased threshold voltage (VTE) limiting data retention of the memory transistor.

One problem with conventional memory transistors and methods of forming the same is that the charge trapping layer typically has poor or decreasing data retention over time, limiting the useful transistor lifetime. Referring to FIG. 1A, if the charge trapping layer is silicon (Si) rich there is a large, initial window or difference between VTP, represented by graph or line 102, and the VTE, represented by line 104, but the window collapse very rapidly in retention mode to an end of life (EOL 106) of less than about 1.E+07 seconds.

Referring to FIG. 1B, if on the other hand the charge trapping layer is if a high quality nitride layer, that is one having a low stoichiometric concentration of Si, the rate of collapse of the window or Vt slope in retention mode is reduced, but the initial program-erase window is also reduced. Moreover, the slope of Vt in retention mode is still appreciably steep and the leakage path is not sufficiently minimized to significantly improve data retention, thus EOL 106 is only moderately improved.

Another problem is that increasingly semiconductor memories combine logic transistors, such as MOSFET's, with memory transistors in integrated circuits (ICs) fabricated on a common substrate for embedded memory or System-On-Chip (SOC) applications. Many of the current processes for forming performance of memory transistors are incompatible with those used for fabricating logic transistors.

Accordingly, there is a need for memory transistors and methods of forming the same that provides improved data retention and increased transistor lifetime. It is further desirable that the methods of forming the memory device are compatible with those for forming logic elements in the same IC formed on a common substrate.

SUMMARY OF THE INVENTION

The present invention provides a solution to these and other problems, and offers further advantages over conventional memory transistors or devices and methods of forming the same.

In a first aspect, the present invention is directed to a non-volatile memory transistor including: (i) an oxide-nitride-oxide (ONO) dielectric stack on a surface of a semiconductor substrate; and (ii) high work function gate electrode formed over a surface of the ONO dielectric stack. Preferably, the high work function gate electrode comprises a doped polycrystalline silicon or polysilicon (poly) layer. More preferably, the doped polysilicon layer comprises a P+ dopant, such as boron or difluoroborane ($BF_2$), and the substrate comprises a silicon surface on which the ONO dielectric stack is formed to form a silicon-oxide-nitride-oxide-silicon (SONOS) gate stack of a NMOS SONOS memory transistor.

In certain embodiments, the ONO dielectric stack comprises a multi-layer charge storage layer including at least a substantially trap free bottom oxynitride layer and a charge trapping top oxynitride layer. In one version of these embodiments, for example, the top oxynitride layer is formed under conditions selected to form a silicon-rich, oxygen-lean oxynitride layer, and the bottom oxynitride layer is formed under conditions selected to form a silicon-rich, oxygen-rich oxynitride layer.

In another aspect, the present invention is directed to a semiconductor device including both a non-volatile memory transistor and a metal oxide semiconductor (MOS) logic transistor and methods of forming the same. The memory transistor includes an ONO dielectric stack including a multi-layer charge storage layer formed on a surface of a semiconductor substrate, and a high work function gate electrode formed over a surface of the ONO dielectric stack. Preferably, the high work function gate electrode of the memory transistor comprises a doped polysilicon layer. More preferably, the MOS logic transistor also includes a high work function gate electrode formed over a gate oxide on the surface of the substrate.

In one embodiment, the high work function gate electrodes of the memory transistor and the MOS logic transistor comprise a P+ doped polysilicon layer deposited over the ONO stack and gate oxide on a silicon substrate to form an NMOS SONOS memory transistor and a P-type (PMOS) logic transistor. The multi-layer charge storing layer can include, for example, a substantially trap free bottom oxynitride layer and a charge trapping top oxynitride layer.

In one embodiment, a method of forming such a semiconductor device comprises steps of: (i) forming an ONO dielectric stack on a surface of a semiconductor substrate in at least a first region in which a non-volatile memory transistor is to be formed, the ONO dielectric stack including a multi-layer charge storage layer; (ii) forming an oxide layer on the surface of the substrate in a second region in which a MOS logic transistor is to be formed; and (iii) forming a high work function gate electrode on a surface of the ONO dielectric stack. Preferably, the step of forming a high work function gate electrode on a surface of the ONO dielectric stack comprises the step of forming a doped polysilicon layer on a surface of the ONO dielectric stack. More preferably, the step of forming a doped polysilicon layer on a surface of the ONO dielectric stack further comprises the step of also forming the doped polysilicon layer on a surface of the oxide layer of the MOS logic transistor form a high work function gate electrode thereon.

In certain embodiments, the semiconductor substrate includes a silicon surface over which the ONO dielectric stack is formed, and the step of forming a doped polysilicon layer comprises the step of forming a P+ doped polysilicon layer to form an NMOS SONOS memory transistor and a PMOS logic transistor. Generally, the polysilicon layer can be doped by ion implantation with boron or $BF_2$, before or after patterning the polysilicon layer, the ONO dielectric stack and the oxide layer to form gate stacks of the memory transistor and the MOS logic transistor.

In other embodiments, the step of forming the ONO dielectric stack comprises the step of forming a multi-layer charge storage layer overlying a lower or tunnel oxide layer on the surface of the substrate, followed depositing or growing an upper or blocking oxide layer over the multi-layer charge storage layer. Preferably, the step of forming the multi-layer charge storage layer comprises the step of forming a substantially trap free bottom oxynitride layer followed by forming a charge trapping top oxynitride layer overlying the trap free bottom oxynitride layer. More preferably, the bottom oxynitride layer is formed under conditions selected to form a silicon-rich, oxygen-rich oxynitride layer, and the top oxynitride layer is formed under conditions selected to form a silicon-rich, oxygen-lean oxynitride layer. Optionally, the charge trapping top oxynitride layer formed, for example, in a chemical vapor deposition (CVD) process using a process gas comprising Bis-TertiarylButylAminoSilane (BTBAS) selected to increase a concentration of carbon and thereby the number of traps therein.

BRIEF DESCRIPTION OF THE DRAWINGS

These and various other features and advantages of the present invention will be apparent upon reading of the following detailed description in conjunction with the accompanying drawings and the appended claims provided below, where:

DETAILED DESCRIPTION

Figure 1A:
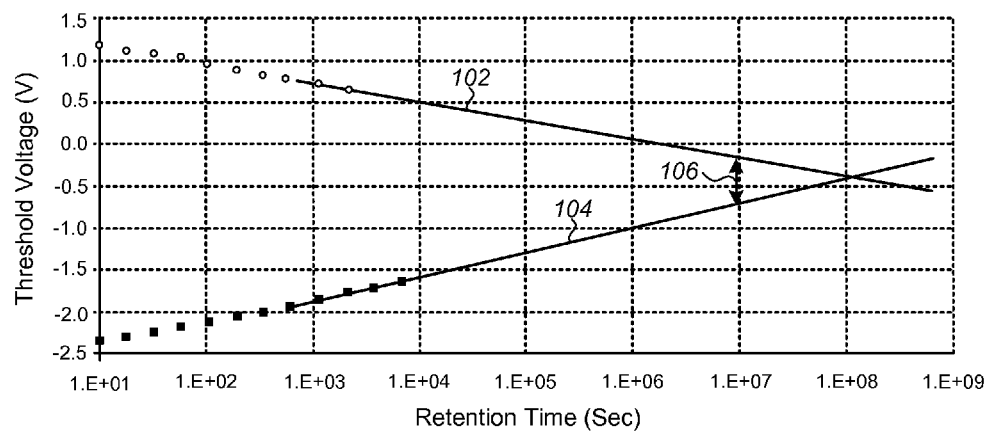
FIG. 1A is a graph showing data retention for a memory transistor using a charge storage layer formed according to a conventional method and having a large initial difference between programming and erase voltages but which loses charge quickly.
Figure 1B:
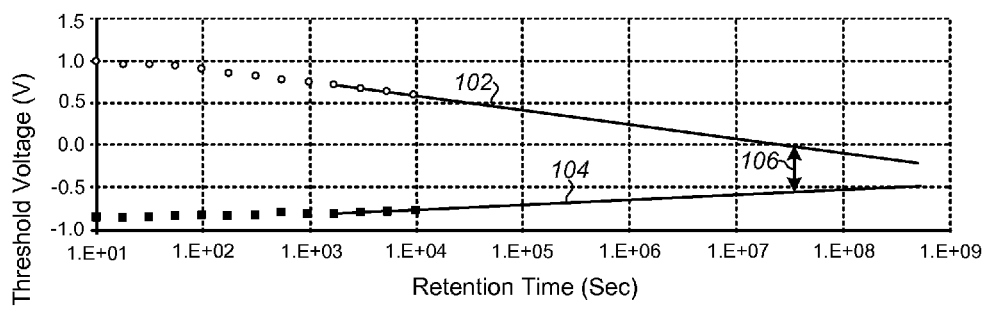
FIG. 1B is a graph showing data retention for a memory transistor using a charge storage layer formed according to a conventional method and having a smaller initial difference between programming and erase voltages.

The present invention is directed generally to non-volatile memory transistor including a multi-layer charge storage layer and high work function gate electrode to increase data retention and/or to improve programming time and efficiency. The structure and method are particularly useful for embedded memory or System-On-Chip (SOC) applications in which a semiconductor device includes both a logic transistor and non-volatile memory transistor comprising high work function gate electrodes formed on a common substrate.

In the following description, for purposes of explanation, numerous specific details are set forth in order to provide a thorough understanding of the present invention. It will be evident, however, to one skilled in the art that the present invention may be practiced without these specific details. In other instances, well-known structures, and techniques are not shown in detail or are shown in block diagram form in order to avoid unnecessarily obscuring an understanding of this description.

Reference in the description to "one embodiment" or "an embodiment" means that a particular feature, structure, or characteristic described in connection with the embodiment is included in at least one embodiment of the invention. The appearances of the phrase "in one embodiment" in various places in the specification do not necessarily all refer to the same embodiment. The term "to couple" as used herein may include both to directly connect and to indirectly connect through one or more intervening components.

Briefly, a non-volatile memory transistor according to the present invention includes a high work function gate electrode formed over an oxide-nitride-oxide (ONO) dielectric stack. By high work function gate electrode it is meant that the minimum energy needed to remove an electron from the gate electrode is increased.

In certain preferred embodiments, the high work function gate electrode comprises a doped polycrystalline silicon or polysilicon (poly) layer, the fabrication of which can be can be readily integrated into standard complementary metal-oxide-semiconductor (CMOS) process flows, such as those used fabricate metal-oxide-semiconductor (MOS) logic transistors, to enable fabrication of semiconductor memories or devices including both memory and logic transistors. More preferably, the same doped polysilicon layer can also be patterned to form a high work function gate electrode for the MOS logic transistor, thereby improving the performance of the logic transistor and increasing the efficiency of the fabrication process. Optionally, the ONO dielectric stack includes a multi-layer charge storage or charge trapping layer to further improve performance, and in particular data retention, of the memory transistor.

A semiconductor device including a non-volatile memory transistor comprising a high work function gate electrode and methods of forming the same will now be described in detail with reference to FIGS. 2A through 2D, which are partial cross-sectional side views of intermediate structures illustrating a process flow for forming a semiconductor device including both memory and logic transistors. For purposes of clarity, many of the details of semiconductor fabrication that are widely known and are not relevant to the present invention have been omitted from the following description.

Referring to FIG. 2, fabrication of the semiconductor device begins with formation of an ONO dielectric stack 202 over a surface 204 of a wafer or substrate 206. Generally, the ONO dielectric stack 202 includes a thin, lower oxide layer or tunneling oxide layer 208 that separates or electrically isolates a charge trapping or storage layer 210 from a channel region (not shown) of the memory transistor in the substrate 206, and a top or blocking oxide layer 212. Preferably, as noted above and as shown in FIGS. 2A-2D, the charge storage layer 210 is a multi-layer charge storage layer including at least a top, charge trapping oxynitride layer 210A and a lower, substantially trap free oxynitride layer 210B.

Generally, the substrate 206 may include any known silicon-based semiconductor material including silicon, silicon-germanium, silicon-on-insulator, or silicon-on-sapphire substrate. Alternatively, the substrate 206 may include a silicon layer formed on a non-silicon-based semiconductor material, such as gallium-arsenide, germanium, gallium-nitride, or aluminum-phosphide. Preferably, the substrate 206 is a doped or undoped silicon substrate.

The lower oxide layer or tunneling oxide layer 208 of the ONO dielectric stack 202 generally includes a relatively thin layer of silicon dioxide ($SiO_2$) of from about 15 angstrom (Å) to about 22 Å, and more preferably about 18 Å. The tunneling oxide layer 208 can be formed or deposited by any suitable means including, for example, being thermally grown or deposited using chemical vapor deposition (CVD). In a preferred embodiment, the tunnel oxide layer is formed or grown using a steam anneal. Generally, the process includes a wet-oxidizing method in which the substrate 206 is placed in a deposition or processing chamber, heated to a temperature from about 700° C. to about 850° C., and exposed to a wet vapor for a predetermined period of time selected based on a desired thickness of the finished tunneling oxide layer 208. Exemplary process times are from about 5 to about 20 minutes. The oxidation can be performed at atmospheric or at low pressure.

In a preferred embodiment, the oxynitride layers 210A, 210B, of the multi-layer charge storage layer 210 are formed or deposited in separate steps utilizing different processes and process gases or source materials, and have an overall or combined thickness of from about 70 Å to about 150 Å, and more preferably about 100 Å. The lower, trap free oxynitride layer 210B can be formed or deposited by any suitable means including, for example, deposition in a low pressure CVD process using a process gas including a silicon source, such as silane ($SiH_4$), chlorosilane ($SiH_3Cl$), dichlorosilane ($SiH_2Cl_2$), tetrachlorosilane ($SiCl_4$), a nitrogen source, such as nitrogen ($N_2$), ammonia ($NH_3$), nitrogen trioxide ($NO_3$) or nitrous oxide ($N_2O$), and an oxygen-containing gas, such as oxygen ($O_2$) or $N_2O$. In one embodiment the trap free oxynitride layer 210B is deposited in a low pressure CVD process using a process gas including dichlorosilane, $NH_3$ and $N_2O$, while maintaining the chamber at a pressure of from about 5 millitorr (mT) to about 500 mT, and maintaining the substrate at a temperature of from about 700° C. to about 850° C. and more preferably at least about 780° C., for a period of from about 2.5 minutes to about 20 minutes. In particular, the process gas can include a first gas mixture of $N_2O$ and $NH_3$ mixed in a ratio of from about 8:1 to about 1:8 and a second gas mixture of DCS and $NH_3$ mixed in a ratio of from about 1:7 to about 7:1, and can be introduced at a flow rate of from about 5 to about 200 standard cubic centimeters per minute (sccm).

The top, charge trapping oxynitride layer 210A can be deposited over the bottom oxynitride layer 210B in a CVD process using a process gas including Bis-TertiaryButylAminoSilane (BTBAS). It has been found that the use of BTBAS increases the number of deep traps formed in the oxynitride by increasing the carbon level in the charge trapping oxynitride layer 210A. Moreover, these deep traps reduce charge losses due to thermal emission, thereby further improving data retention. More preferably, the process gas includes BTBAS and ammonia ($NH_3$) mixed at a predetermined ratio to provide a narrow band gap energy level in the oxynitride charge trapping layer. In particular, the process gas can include BTBAS and $NH_3$ mixed in a ratio of from about 7:1 to about 1:7. For example, in one embodiment the charge trapping oxynitride layer 210A is deposited in a low pressure CVD process using BTBAS and ammonia $NH_3$ at a chamber pressure of from about 5 mT to about 500 mT, and at a substrate temperature of from about 700° C. to about 850° C. and more preferably at least about 780° C., for a period of from about 2.5 minutes to about 20 minutes.

It has been found that an oxynitride layer produced or deposited under the above conditions yields a trap-rich oxynitride layer 210A, which improves the program and erase speed and increases of the initial difference (window) between program and erase voltages without compromising a charge loss rate of the memory transistor, thereby extending the operating life (EOL) of the device. Preferably, the charge trapping oxynitride layer 210A has a charge trap density of at least about $1E10/cm^2$, and more preferably from about $1E12/cm^2$ to about $1E14/cm^2$.

Alternatively, the charge trapping oxynitride layer 210A can be deposited over the bottom oxynitride layer 210B in a CVD process using a process gas including BTBAS and substantially not including ammonia ($NH_3$). In this alternative embodiment of the method, the step of depositing the top, charge trapping oxynitride layer 210A is followed by a thermal annealing step in a nitrogen atmosphere including nitrous oxide ($N_2O$), $NH_3$, and/or nitrogen oxide (NO).

Preferably, the top, charge trapping oxynitride layer 210A is deposited sequentially in the same CVD tool used to form the bottom, trap free oxynitride layer 210B, substantially without breaking vacuum on the deposition chamber. More preferably, the charge trapping oxynitride layer 210A is deposited substantially without altering the temperature to which the substrate 206 was heated during deposition of the trap free oxynitride layer 210B.

A suitable thickness for the lower, trap free oxynitride layer 210B has been found to be from about 10 Å to about 80 Å, and a ratio of thicknesses between the bottom layer and the top, charge trapping oxynitride layer has been found to be from about 1:6 to about 6:1, and more preferably at least about 1:4.

The top oxide layer 212 of the ONO dielectric stack 202 includes a relatively thick layer of $SiO_2$ of from about 20 Å to about 70 Å, and more preferably about 45 Å. The top oxide layer 212 can be formed or deposited by any suitable means including, for example, being thermally grown or deposited using CVD. In a preferred embodiment, the top oxide layer 212 is a high-temperature-oxide (HTO) deposited using CVD process. Generally, the deposition process includes exposing the substrate 308 to a silicon source, such as silane, chlorosilane, or dichlorosilane, and an oxygen-containing gas, such as $O_2$ or $N_2O$ in a deposition chamber at a pressure of from about 50 mT to about 1000 mT, for a period of from about 10 minutes to about 120 minutes while maintaining the substrate at a temperature of from about 650° C. to about 850° C.

Preferably, the top oxide layer 212 is deposited sequentially in the same tool used to form the oxynitride layers 210A, 210B. More preferably, the oxynitride layers 210A, 210B, and the top oxide layer 212 are formed or deposited in the same tool used to grow the tunneling oxide layer 208. Suitable tools include, for example, an ONO AVP, commercially available from AVIZA technology of Scotts Valley, Calif.

Figure 2A:
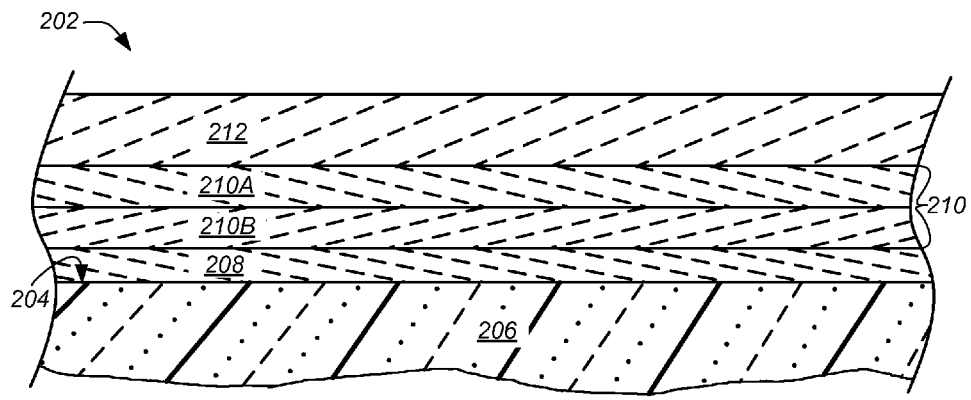
FIGS. 2A through 2D are partial cross-sectional side views of a semiconductor device illustrating a process flow for forming a semiconductor device including a logic transistor and non-volatile memory transistor according to an embodiment of the present invention.
Figure 2B:
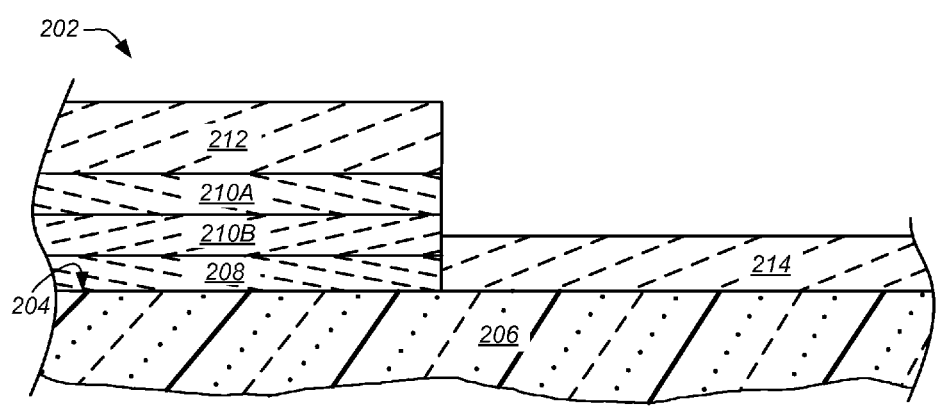

Referring to FIG. 2B, in those embodiments in which the semiconductor device is to further include a logic transistor, such as a MOS logic transistor, formed on the surface of the same substrate the ONO dielectric stack 202 is removed from a region or area of the surface 204 in which the logic transistor is to be formed, and an oxide layer 214 the formed thereon.

Generally, the ONO dielectric stack 202 is removed from the desired region or area of the surface 204 using standard photolithographic and oxide etch techniques. For example, in one embodiment a patterned mask layer (not shown) is formed from a photo-resist deposited on the ONO dielectric stack 202, and the exposed region etched or removed using a low pressure radiofrequency (RF) coupled or generated plasma comprising fluorinated hydrocarbon and/or fluorinated carbon compounds, such as $C_2H_2F_4$ commonly referred to as Freon®. Generally, the processing gas further includes argon (Ar) and nitrogen ($N_2$) at flow rates selected to maintain a pressure in the etch chamber of from about 50 mT to about 250 mT during processing.

The oxide layer 214 of the logic transistor can include a layer of $SiO_2$ having a thickness of from about 30 to about 70 Å, and can be thermally grown or deposited using CVD. In one embodiment, the oxide layer 214 is thermally grown using a steam oxidation process, for example, by maintaining the substrate 206 in a steam atmosphere at a temperature of from about 650° C. to about 850° C. for a period of from about 10 minutes to about 120 minutes.

Next, a doped polysilicon layer is formed on a surface of the ONO dielectric stack 202 and, preferably, the oxide layer 214 of the logic transistor. More preferably, the substrate 206 is a silicon substrate or has a silicon surface on which the ONO dielectric stack is formed to form a silicon-oxide-nitride-oxide-silicon (SONOS) gate stack of a SONOS memory transistor.

Figure 2C:
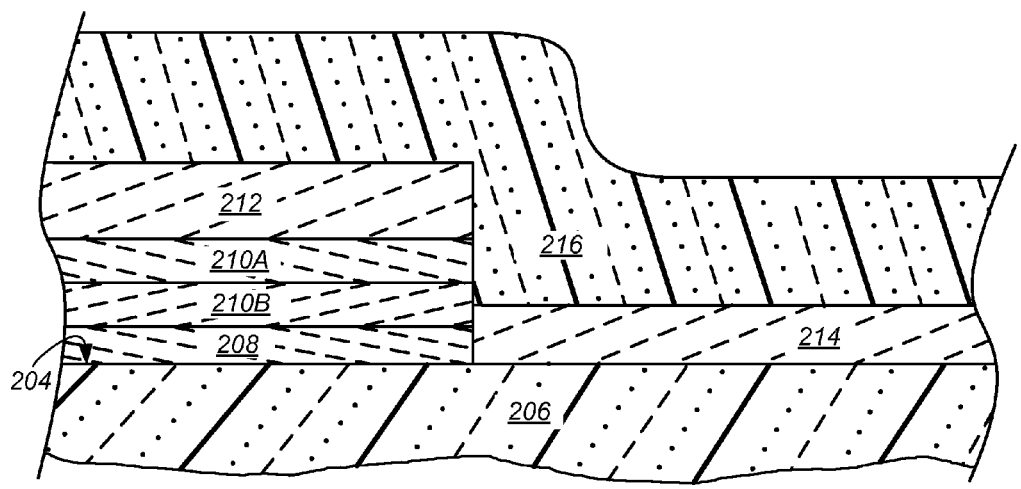

Referring to FIG. 2C, forming of the doped polysilicon layer begins with the deposition of a conformal polysilicon layer 216 having a thickness of from about 200 Å to about 2000 Å over the ONO dielectric stack 202 and the oxide layer 214. The polysilicon layer 216 can be formed or deposited by any suitable means including, for example, deposition in a low pressure CVD process using a silicon source or precursor. In one embodiment the polysilicon layer 216 is deposited in a low pressure CVD process using a silicon containing process gas, such as silane or dichlorosilane, and $N_2$, while maintaining the substrate 206 in a chamber at a pressure of from about 5 to 500 mT, and at a temperature of from about 600° C. to about 1000° C. for a period of from about 20 minutes to about 100 minutes to a substantially undoped polysilicon layer. The polysilicon layer 216 can be formed or grown directly as a doped polysilicon layer through the addition of gases such as phosphine, arsine, diborane or difluoroborane ($BF_2$) to the CVD chamber during the low pressure CVD process.

In one embodiment, the polysilicon layer 216 is doped following the growth or formation in the LPCVD process using ion implantation process. For example, the polysilicon layer 216 can be doped by implanting boron ($B^+$) or $BF_2$ ions at an energy of from about 5 to about 100 kilo-electron volts (keV), and a dose of from about $1e14$ $cm^{-2}$ to about $1e16$ $cm^2$ to form an N-type (NMOS) SONOS memory transistor and, preferably, a P-type (PMOS) logic transistor having high work function gate electrodes. More preferably, the polysilicon layer 216 is doped to a concentration or dose selected so that the minimum energy needed to remove an electron from the gate electrode is from at least about 4.8 electron volts (eV) to about 5.3 eV.

Alternatively, the polysilicon layer 216 can be doped by ion implantation after patterning or etching the polysilicon layer and the underlying dielectric layers. It will be appreciated that this embodiment includes additional masking steps to protect exposed areas of the substrate 206 surface 204 and/or the dielectric layers from receiving undesired doping. However, generally such a masking step is included in existing process flows regardless of whether the implantation occurs before or after patterning.

Figure 2D:
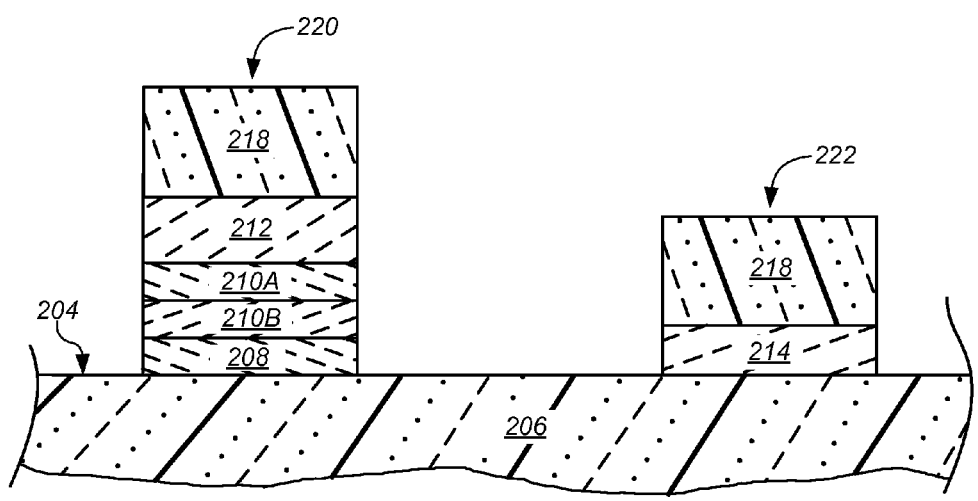

Referring to FIG. 2D, the polysilicon layer 216 and the underlying dielectric stack 202 and oxide layer 214 are patterned or etched to form high work function gate electrodes 218 of the memory transistor 220 and logic transistor 222. In one embodiment polysilicon layer 216 can be etched or patterned using a plasma comprising hydrobromic acid (HBr), chlorine ($CL_2$) and/or oxygen ($O_2$) at a pressure of about 25 mTorr, and a power of about 450 W. The oxide layers 208, 212, 214, and oxynitride layers 210A, 210B, can be etched using standard photolithographic and oxide etch techniques as described. For example, in one embodiment the patterned polysilicon layer 216 is used as a mask, and the exposed oxide layers 208, 212, 214, and oxynitride layers 210A, 210B, etched or removed using low pressure RF plasma. Generally, the plasma is formed from a processing gas comprising a fluorinated hydrocarbon and/or fluorinated carbon compounds, and further including Ar and $N_2$ at flow rates selected to maintain a pressure in the etch chamber of from about 50 mT to about 250 mT during processing.

Finally, the substrate is thermal annealed with a single or multiple annealing steps at a temperature of from about 800° C. to about 1050° C. for a time of from about 1 second to about 5 minutes to drive in ions implanted in the polysilicon layer 216, and to repair damage to the crystal structure of the polysilicon layer caused by ion implantation. Alternatively, advanced annealing techniques, such as flash and laser, can be employed with temperatures as high as 1350° C. and anneal times as low as 1 millisecond.

Figure 3:
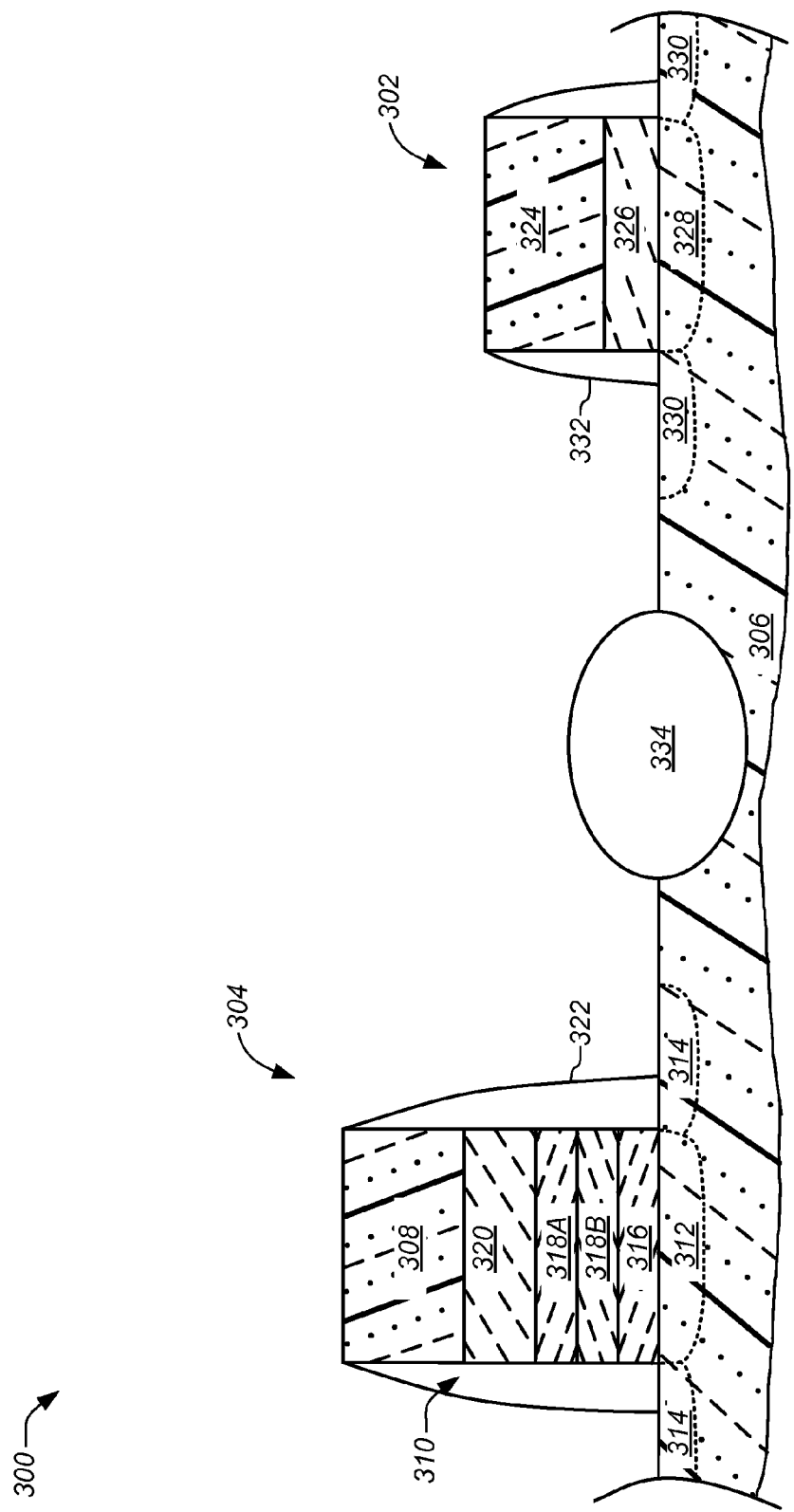
FIG. 3 is a partial cross-sectional side view of a semiconductor device including a logic transistor and non-volatile memory transistor comprising high work function gate electrodes according to an embodiment of the present invention.

A partial cross-sectional side view of a semiconductor device 300 including a logic transistor 302 and non-volatile memory transistor 304 comprising high work function gate electrodes according to an embodiment of the present invention is shown in FIG. 3. Referring to FIG. 3, the memory transistor 304 is formed on a silicon substrate 306 and comprises a high work function gate electrode 308 formed from a doped polysilicon layer overlying a dielectric stack 310. The dielectric stack 310 overlies and controls current through a channel region 312 separating heavily doped source and drain (S/D) regions 314. Preferably, the dielectric stack 310 includes a tunnel oxide 316, a multi-layer charge storage layer 318A, 318B, and a top or blocking oxide layer 320. More preferably, the multi-layer charge storage layer 318A, 318B, includes at least a top, charge trapping oxynitride layer 318A and a lower, substantially trap free oxynitride layer 318B. Optionally, as shown in FIG. 3, the memory transistor 304 further includes one or more sidewall spacers 322 surrounding the gate stack to electrically insulate it from contacts (not shown) to the S/D regions 320 and from other transistors in the semiconductor device formed on the substrate 306.

The logic transistor 302 comprises a gate electrode 324 overlying an oxide layer 326 formed over a channel region 328 separating heavily doped source and drain regions 330, and, optionally, can include one or more sidewall spacers 332 surrounding the gate electrically insulate it from contacts (not shown) to the S/D regions. Preferably, as shown in FIG. 3, the gate electrode 324 of the logic transistor 302 also comprises a high work function gate electrode formed from a doped polysilicon layer.

Generally, the semiconductor device 300 further includes a number of isolation structures 334, such as a local oxidation of silicon (LOCOS) region or structure, a field oxidation region or structure (FOX), or a shallow trench isolation (STI) structure to electrically isolate individual transistors formed on the substrate 306 from one another.

The foregoing description of specific embodiments and examples of the invention have been presented for the purpose of illustration and description, and although the invention has been described and illustrated by certain of the preceding examples, it is not to be construed as being limited thereby. They are not intended to be exhaustive or to limit the invention to the precise forms disclosed, and many modifications, improvements and variations within the scope of the invention are possible in light of the above teaching. It is intended that the scope of the invention encompass the generic area as herein disclosed, and by the claims appended hereto and their equivalents. The scope of the present invention is defined by the claims, which includes known equivalents and unforeseeable equivalents at the time of filing of this application.

What is claimed is:

1. A method of forming a semiconductor device comprising:
    forming an oxide-nitride-oxide (ONO) dielectric stack on a surface of a semiconductor substrate in at least a first region in which a non-volatile memory transistor is to be formed by forming at least a substantially trap free bottom oxynitride layer followed by forming a charge trapping top oxynitride later, wherein the ONO dielectric stack includes a multi-layer charge storage layer;
    forming an oxide layer on the surface of the substrate in a second region in which a metal oxide semiconductor (MOS) logic transistor is to be formed; and
    forming a doped polysilicon layer on the surface of a ONO dielectric stack and on a surface of the oxide layer of the MOS logic transistor to form a first high work function gate electrode on the surface of the ONO dielectric stack while concurrently forming a second high work function gate electrode on the oxide layer of the MOS logic transistor.

2. A method according to claim 1, wherein the semiconductor substrate comprises a silicon surface over which the ONO dielectric stack is formed, the doped polysilicon layer comprises a P+ dopant, and wherein the method further comprises patterning the doped polysilicon layer, the ONO dielectric stack and the oxide layer to form an N-type (NMOS) silicon-oxide-nitride-oxide-silicon (SONOS) memory transistor and a P-type (PMOS) logic transistor.

3. A method comprising:
    forming an oxide-nitride-oxide (ONO) dielectric stack on a surface of a substrate in at least a first region in which a non-volatile memory transistor is to be formed, the ONO dielectric stack comprising a multi-layer charge storage layer including a silicon-rich, oxygen-lean top silicon oxynitride layer and a silicon-rich, oxygen-rich bottom silicon oxynitride layer;
    forming a gate oxide on the surface of the substrate in a second region in which a metal oxide semiconductor (MOS) logic transistor is to be formed; and
    forming a high work function gate electrode on the gate oxide.

4. The method of claim 3, further comprising forming a high work function gate electrode formed over a surface of the ONO dielectric stack of the non-volatile memory transistor.

5. The method of claim 4, wherein forming the ONO dielectric stack comprises forming a trap-rich top silicon oxynitride layer and a substantially trap free silicon bottom oxynitride layer.

6. The method of claim 4, wherein the substrate comprises a silicon surface over which the ONO dielectric stack is formed, and wherein forming the high work function gate electrode of the non-volatile memory transistor comprises forming a P+ doped polysilicon layer to form a nMOS silicon-oxide-nitride-oxide-silicon (SONOS) memory transistor.

7. The method of claim 6, wherein forming the high work function gate electrode of the logic transistor comprises forming a P+ doped polysilicon layer to form a pMOS logic transistor.

8. The method of claim 4, wherein the substrate comprises a silicon surface over which the ONO dielectric stack is formed, and wherein forming the high work function gate electrode of the non-volatile memory transistor comprises forming a N+ doped polysilicon layer to form a pMOS silicon-oxide-nitride-oxide-silicon (SONOS) memory transistor.

9. The method of claim 8, wherein forming the high work function gate electrode of the logic transistor comprises forming a N+ doped polysilicon layer to form a nMOS logic transistor.

10. The method of claim 4, wherein forming the high work function gate electrode of the non-volatile memory transistor and forming the high work function gate electrode of the logic transistor comprises forming and patterning a single, doped polysilicon layer.

11. The method of claim 3, wherein forming the ONO dielectric stack comprises forming a trap-rich top silicon oxynitride layer and a substantially trap free silicon bottom oxynitride layer.

12. The method of claim 3, wherein the substrate comprises a silicon surface, and wherein forming the high work function gate electrode of the logic transistor comprises forming a P+ doped polysilicon layer to form a pMOS logic transistor.

13. The method of claim 3, wherein the substrate comprises a silicon surface, and wherein forming the high work function gate electrode of the logic transistor comprises forming a N+ doped polysilicon layer to form a nMOS logic transistor.

14. A method comprising:
    forming an oxide-nitride-oxide (ONO) dielectric stack on a surface of a substrate in at least a first region in which a non-volatile memory transistor is to be formed, the ONO dielectric stack comprising a multi-layer charge storage layer including a trap-rich top silicon nitride layer and a substantially trap free silicon bottom nitride layer;
    forming a gate oxide on the surface of the substrate in a second region in which a metal oxide semiconductor (MOS) logic transistor is to be formed; and
    forming a high work function gate electrode on the gate oxide.

15. The method of claim 14, further comprising forming a high work function gate electrode formed over a surface of the ONO dielectric stack of the non-volatile memory transistor.

16. The method of claim 15, wherein forming the high work function gate electrode of the non-volatile memory transistor comprises forming a P+ doped polysilicon layer to form a nMOS silicon-oxide-nitride-oxide-silicon (SONOS) memory transistor, and wherein forming the high work function gate electrode of the logic transistor comprises forming a P+ doped polysilicon layer to form a pMOS logic transistor.

* * * * *